United States Patent
Yen et al.

(10) Patent No.: US 12,483,222 B2
(45) Date of Patent: Nov. 25, 2025

(54) SPURIOUS MODE REDUCTION FOR ELECTROMECHANICAL RESONATOR CIRCUIT

(71) Applicant: TEXAS INSTRUMENTS INCORPORATED, Dallas, TX (US)

(72) Inventors: Ting-Ta Yen, San Jose, CA (US); Jeronimo Segovia Fernandez, San Jose, CA (US); Sean Chang, Hercules, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 322 days.

(21) Appl. No.: 18/173,950

(22) Filed: Feb. 24, 2023

(65) Prior Publication Data

US 2024/0291466 A1    Aug. 29, 2024

(51) Int. Cl.
*H03H 9/15*    (2006.01)
*H03H 3/02*    (2006.01)
*H03H 9/02*    (2006.01)

(52) U.S. Cl.
CPC .............. *H03H 9/15* (2013.01); *H03H 3/02* (2013.01); *H03H 9/02007* (2013.01)

(58) Field of Classification Search
CPC ........ H03H 9/02; H03H 9/15; H03H 9/02007; H03H 3/02
USPC ........................................................ 333/187
See application file for complete search history.

(56) References Cited

U.S. PATENT DOCUMENTS

| | | |
|---|---|---|
| 5,373,268 A | 12/1994 | Dworsky et al. |
| 6,087,198 A | 7/2000 | Panasik |
| 6,548,942 B1 | 4/2003 | Panasik |
| 6,870,445 B2 | 3/2005 | Kawakubo et al. |
| 7,834,524 B2 | 11/2010 | Wang et al. |
| 7,868,448 B2 | 1/2011 | Metzger |
| 9,129,886 B2 | 9/2015 | Jacobsen et al. |
| 9,503,047 B2 | 11/2016 | Jacobsen et al. |
| 9,524,881 B2 | 12/2016 | Jiang et al. |
| 9,660,603 B2 | 5/2017 | Jiang et al. |
| 9,735,338 B2 | 8/2017 | Guillou et al. |
| 9,876,483 B2 | 1/2018 | Ortiz et al. |
| 9,896,330 B2 | 2/2018 | Wachtler et al. |
| 9,929,714 B2 | 3/2018 | Jacobsen et al. |
| 10,135,415 B2 | 11/2018 | Soman et al. |
| 10,312,185 B2 | 6/2019 | Bahr et al. |

(Continued)

FOREIGN PATENT DOCUMENTS

| | | |
|---|---|---|
| CN | 103964376 A | 8/2014 |
| DE | 102017203381 A1 | 4/2018 |

(Continued)

OTHER PUBLICATIONS

International Searching Authority, Search Report for PCT/US2024/016839, mailed Jun. 24, 2024, 3 pages.

(Continued)

*Primary Examiner* — Andrea Lindgren Baltzell
*Assistant Examiner* — Abigail Amir Yaldo
(74) *Attorney, Agent, or Firm* — Frank D. Cimino

(57) ABSTRACT

One example described herein includes an integrated circuit (IC). The IC includes a substrate having opposing first and second sides. The second side can include a curved surface. The IC also includes a resonator on the first side. A curvature of the curved surface can reflect a property of the resonator.

22 Claims, 11 Drawing Sheets

(56) References Cited

U.S. PATENT DOCUMENTS

| | | |
|---|---|---|
| 10,594,286 B2 | 3/2020 | Chang et al. |
| 11,075,613 B2 | 7/2021 | Murakami et al. |
| 2006/0170519 A1 | 8/2006 | Thalhammer et al. |
| 2007/0125161 A1 | 6/2007 | Bryzek et al. |
| 2008/0054428 A1 | 3/2008 | Lam |
| 2008/0279498 A1 | 11/2008 | Sampsell et al. |
| 2009/0267457 A1 | 10/2009 | Barber et al. |
| 2011/0050357 A1 | 3/2011 | Kim et al. |
| 2011/0249889 A1 | 10/2011 | Kothandaraman et al. |
| 2013/0105921 A1 | 5/2013 | Najafi et al. |
| 2017/0026029 A1 | 1/2017 | Bahai et al. |
| 2017/0033766 A1 | 2/2017 | Jacobsen et al. |
| 2017/0330841 A1 | 11/2017 | Cook et al. |
| 2018/0109237 A1 | 4/2018 | Wasilik et al. |
| 2018/0246323 A1 | 8/2018 | Fedigan et al. |
| 2019/0007020 A1 | 1/2019 | Yen |
| 2019/0007023 A1 | 1/2019 | Yen |
| 2019/0052247 A1 | 2/2019 | Yen |
| 2019/0055121 A1 | 2/2019 | Partridge et al. |
| 2019/0165756 A1 | 5/2019 | Murakami et al. |
| 2019/0207581 A1 | 7/2019 | Yen et al. |
| 2020/0177159 A1 | 6/2020 | Liu et al. |
| 2021/0125931 A1 | 4/2021 | Dogiamis et al. |
| 2022/0140801 A1 | 5/2022 | McHugh et al. |
| 2022/0368307 A1* | 11/2022 | Sato .................. H03H 9/17 |

FOREIGN PATENT DOCUMENTS

| | | |
|---|---|---|
| JP | 2021190908 A | 12/2021 |
| JP | 2022189419 A | 12/2022 |

OTHER PUBLICATIONS

International Searching Authority, Written Opinion for PCT/US2024/016839, mailed Jun. 24, 2024, 4 pages.
Search Report for PCT Patent Application No. PCT/US2021/012880, date of mailing Apr. 30, 2021, 8 pages.
CN103964376A, English Machine Translation, 24 pages.
Search Report for PCT Patent Application No. PCT/US2020/027946, date of mailing Jul. 2, 2020, 2 pages.
Written Opinion for PCT Patent Application No. PCT/US2020/027946, date of mailing Jul. 2, 2020, 4 pages.
Arun Paidmarri et all, "A 0.68V 0.68mW 2.4GHz PLL for Ultra-low Power RF Systems", 2015 IEEE Radio Frequency Integrated Circuits Symposium (RFIC), May 17-19, 2015, Phoenix, AZ, pp. 1-4.
Andrew Nelson et all, "A 22uW, 2.0GHz FBAR Oscillator", 2011 IEEE Radio Frequency Integrated Circuits Symposium (RFIC), Jun. 5-7, 2011, Baltimore, MD, pp. 1-4.
Remco Strijbos et al, "Design and Characterisation of High-Q Solidly-Mounted Bulk Acoustic Wave Filters", 2007 Proceedings 57th Electronic Components and Technology Conference, May 29-Jun. 1, 2007, Reno, Nevada, pp. 169-174.

* cited by examiner

SPURIOUS MODE REDUCTION FOR ELECTROMECHANICAL RESONATOR CIRCUIT

BACKGROUND

Electromechanical resonators are implemented in a variety of different types of applications, such as radio frequency (RF) filters and oscillators. A variety of different types of electromechanical resonators exist. Electromechanical resonators include bulk acoustic wave (BAW) resonators and standing acoustic wave (SAW) resonators. Acoustic wave resonators can generate and confine acoustic energy in the resonator to increase the quality factor (Q) of the resonator. However, acoustic waves can escape from the resonator and become reflected at boundaries where there is an acoustic impedance mismatch, such as the bottom surface of the substrate. Such reflections generate spurious modes that interfere with the main resonance mode of vibration. As a result, the temperature coefficient and frequency (TCF) can also change, which can affect the stability of the resonator.

SUMMARY

One example described herein includes an electromechanical system. The electromechanical system includes a substrate having opposing first and second sides. The second side can include a curved surface. The electromechanical system also includes a resonator on the first side. A curvature of the curved surface can reflect a property of the resonator.

Another example described herein includes a method for forming an electromechanical system. The method includes forming a resonator on a first side of a substrate and forming a curved surface on a second side the substrate opposing the first side. The curved surface can have a curvature that reflects a property of the resonator.

DETAILED DESCRIPTION

This description relates generally to electromechanical systems, and more particularly to a curved surface for an electromechanical resonator. Examples of electromechanical resonators are bulk acoustic wave (BAW) resonators and standing acoustic wave (SAW) resonators, which generate acoustic waves in response to electrical signals. The electromechanical resonator can generate and confine a signal (e.g., an acoustic signal) within the resonator. However, some of the signal can escape from the resonator. The escaped signal can propagate through the substrate and reflect from an opposite surface of the substrate back to the resonator. Multiple reflections can occur which produce standing wave patterns, or spurious modes. Such spurious modes can deleteriously affect the operation of the resonator, especially if the spurious modes occur at frequencies close to an operation frequency (e.g., a target resonant frequency) of the resonator, and/or the frequencies of other electrical signals that are proximate the resonator.

To mitigate deleterious effects of the reflections of the acoustic energy, the electromechanical resonator can include a curved surface that is arranged opposite the resonator. The curved surface can include an indentation or recess formed in the side (e.g., surface) of the substrate opposite to the resonator, at least a portion of which includes non-planar curvature. For example, the electromechanical resonator can include a substrate having a first side and a second side opposite the first side. The resonator can be formed on the first side, such that the curved surface can be formed on the second side. The curvature of the curved surface can be configured based on a property of the resonator, such as a resonant frequency of the resonator, which also sets a wavelength of a signal (e.g., an acoustic wave) provided by the resonator at resonance. The curvature can be configured to introduce destructive interference between the escaped signal and the reflected signal, and/or scattering of the reflected signal, to reduce or eliminate the spurious modes. As an example, the curved surface can be formed as a concave recess in the surface of the second side. The concave recess can have a height/depth that is based on the signal wavelength (e.g., above one-fifth of the signal wavelength of the acoustic wave). The radius of the curvature can also be based on the signal wavelength.

Figure 1:
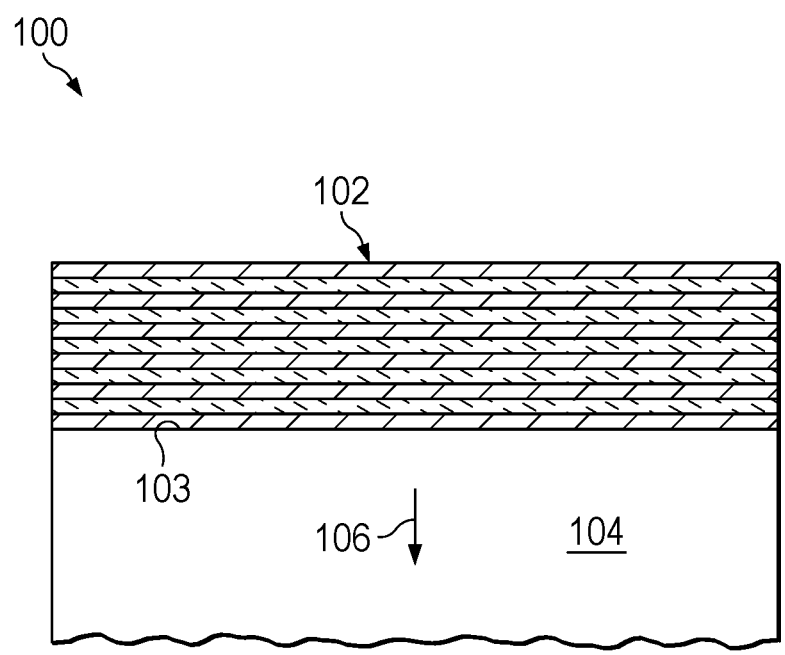
FIG. 1 is a schematic of an example electromechanical resonator.

FIG. 1 is a schematic of an example electromechanical resonator 100. The electromechanical resonator 100 includes a resonator 102 formed on a first side 103 of a semiconductor substrate 104. The resonator 102 can correspond to an acoustic resonator, such as a bulk acoustic wave (BAW) resonator that includes a piezoelectric material arranged between electrodes and acoustic reflectors (e.g., Bragg reflectors). The resonator 102 can generate a vibration signal (e.g., an acoustic signal) responsive to electrical signals at the electrodes, and confine the signal energy between the reflectors to provide for a higher quality factor (Q) of the resonator 102.

Some of the signal energy provided by the resonator 102 can escape the confinement provided by the reflectors of the resonator 102, with the escaped signal energy having a thickness propagation mode in which the signal propagates along a thickness of semiconductor substrate 104 and normal to the plane of the resonator 102. As a first example, the resonator 102 can be configured as a BAW resonator that provides the resonant acoustic waves in the vertical direction (e.g., normal to the plane of the resonator 102). As a second example, the resonator 102 can be configured as a lateral resonator, with some of the escaped acoustic energy having a component in the vertical direction. In both examples, the thickness propagation mode of the acoustic energy is therefore provided through the semiconductor substrate 104 in a vertical manner, such as in a direction orthogonal to the first side 103 of the semiconductor substrate 104. In the example of FIG. 1, the thickness propagation mode that escaped the resonator and reached the substrate is demonstrated as an arrow 106 pointing in the vertical direction away from the resonator 102. The escaped acoustic energy 106 can thus be reflected from one or more of the surfaces of the substrate 104, such as a surface opposite (not shown in FIG. 1) the first side 103 of the semiconductor substrate 104 on which the resonator 102 is formed.

In some examples, the opposite side of the semiconductor substrate can be flat, and the escaped acoustic energy/signal can be reflected back to the resonator at the same orthogonal direction to the first side 103. Multiple reflections can occur. The constructive interference between the escaped acoustic signal and the reflected acoustic signal can produce standing wave patterns, which lead to spurious modes. If the spurious modes occur at frequencies close to an operation frequency (e.g., a target resonant frequency) of the resonator, such spurious modes can negatively affect the stability and/or other aspects of operations of the resonator 102. Also, if the spurious modes occur at frequencies close to those of other electrical signals that are proximate the resonator (e.g., clock signals), such spurious modes can also negatively affect other circuities.

Figure 2:
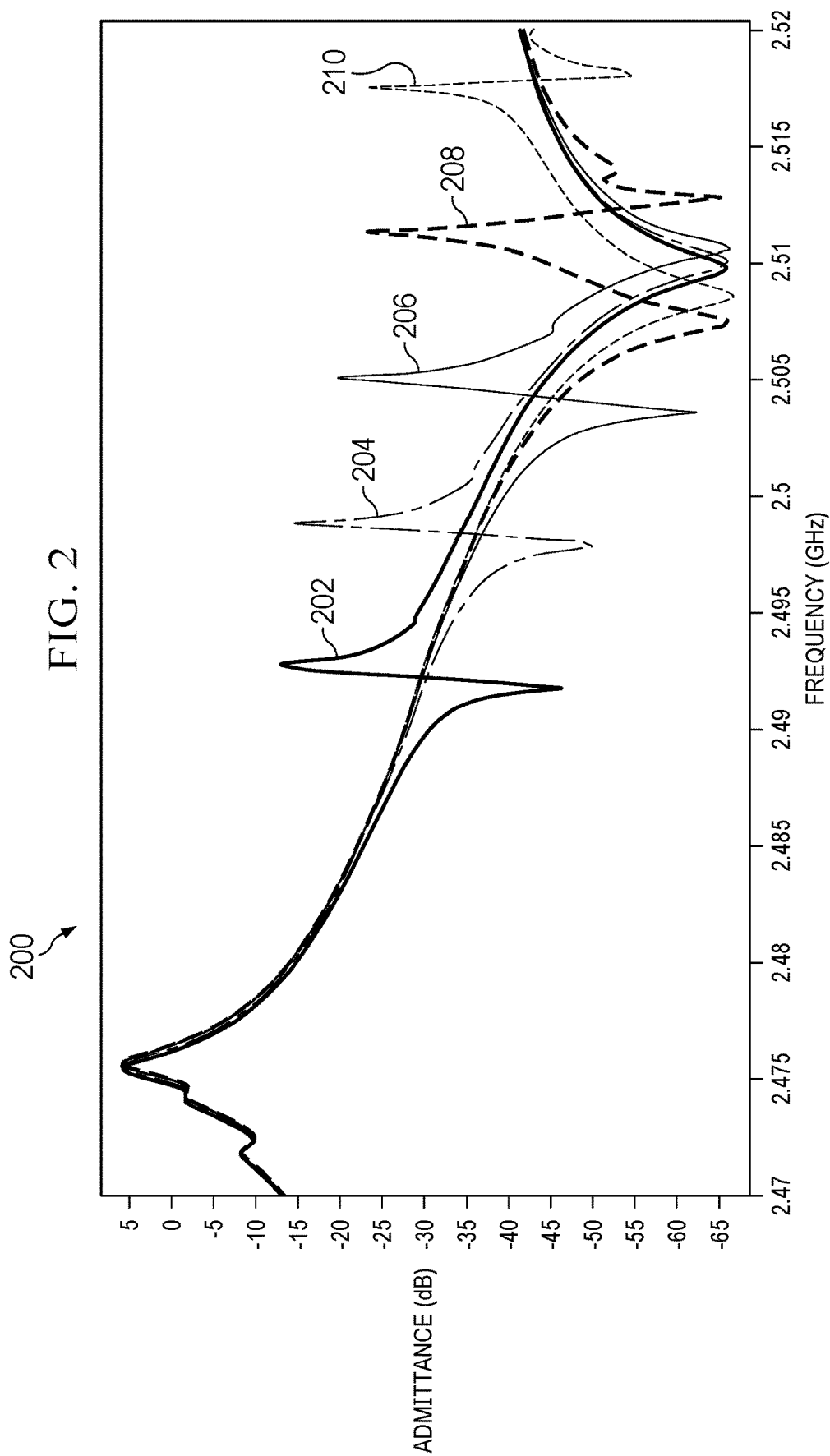
FIG. 2 include graphs illustrating example relationships between the admittance and the signal frequency of an electromechanical resonator.

FIG. 2 includes graphs illustrating an example relationship between the admittance and the signal frequency of an electromechanical resonator having a flat semiconductor backside opposite to the resonator. The admittance is contributed by a semiconductor substrate of the electromechanical resonator. FIG. 2 includes graphs 202, 204, 206, 208, and 210 representing example admittance-frequency relationships for semiconductor substrate thicknesses of, respectively, 19 μm, 19.05 μm, 19.1 μm, 19.15 μm, and 19.2 μm.

As shown in FIG. 2, each of graphs 202-210 includes a peak admittance at around 2.475 GHz, which can be the resonant frequency of the resonator. Also, each of graphs 202-210 includes a local maximum admittance at different frequencies outside of the 2.475 GHz resonant frequency. The local maximum admittance can be spurious mode due to reflections between the resonator and the back surface. The different thickness of the semiconductor substrate can provide different propagation distances of the escaped signal and the reflected signal, which in turn can set the frequency of the spurious mode standing wave. Accordingly, the frequency of the spurious mode can be different for different semiconductor substrate thicknesses. For example, graph 202 shows that a spurious mode at a frequency of 2.493 GHz for a semiconductor substrate thicknesses of 19 μm, graph 204 shows a spurious mode at a frequency of 2.497 GHz for a semiconductor substrate thicknesses of 19.05 μm, graph 206 shows a spurious mode at a frequency of 2.505 GHz for a semiconductor substrate thicknesses of 19.1 μm, graph 208 shows a spurious mode at a frequency of 2.511 GHz for a semiconductor substrate thicknesses of 19.15 μm, and graph 210 shows a spurious mode at a frequency of 2.518 GHz.

The spurious mode signals can negatively affect the stability and/or other aspects of operations of the resonator, especially if the spurious mode signals have frequencies that are close to the resonant frequency of the resonator, as shown in FIG. 2. Also, because the spurious mode signals have frequencies that are close to the resonant frequencies, removal/attenuation of the spurious mode signals by filtering (e.g., bandpass filtering) can be challenging. Also, as shown in FIG. 2, spurious mode frequency depends on the thickness of the semiconductor substrate, and the thickness of the semiconductor substrate may vary due to fabrication tolerance. Accordingly, the spurious mode frequency may vary between different integrated circuits/systems and can become unpredictable, which makes it even more challenging to remove/attenuate the spurious mode signals by filtering.

Figure 3:
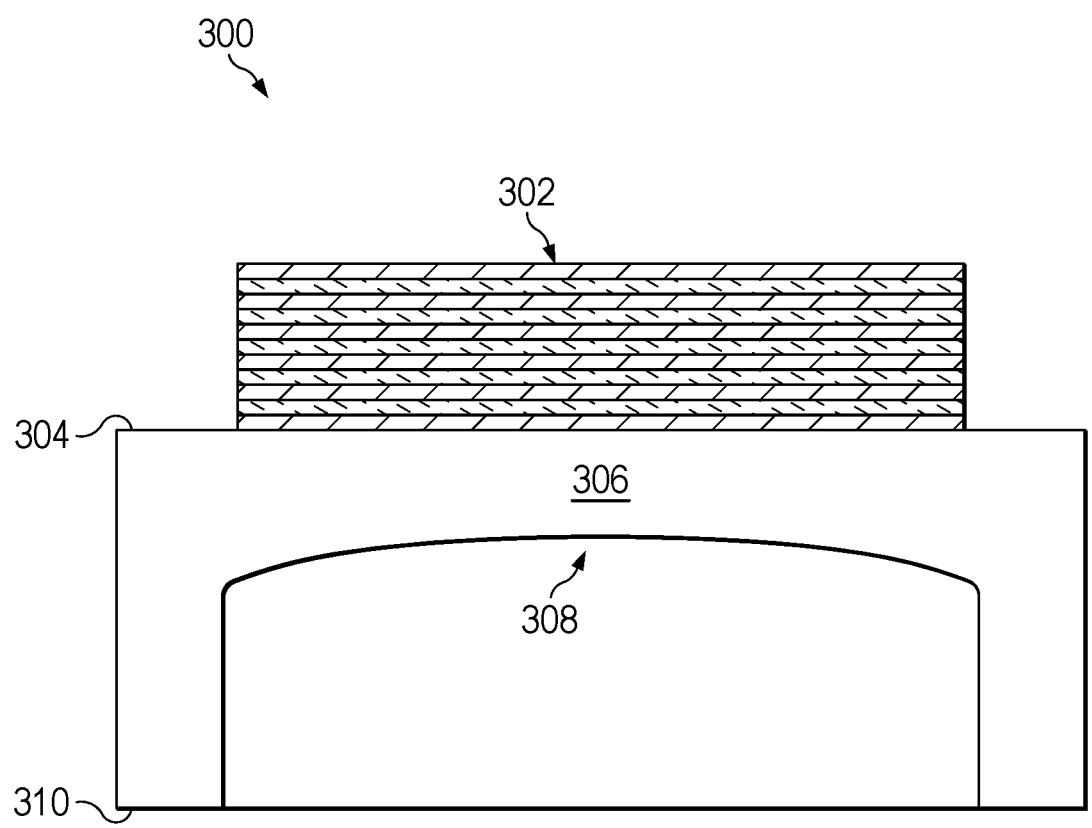
FIG. 3 is a schematic illustrating an example electromechanical resonator.

FIG. 3 is a schematic illustrating a cross-section view of an electromechanical resonator 300 that can address at least some of issues described above. The electromechanical resonator 300 includes a resonator 302 formed on a first side 304 of a semiconductor substrate 306. As an example, the resonator 302 can include an acoustic resonator, such as a BAW resonator, that includes a piezoelectric material arranged between electrodes and acoustic reflectors (e.g., Bragg reflectors). As described above, the resonator 302 can be configured to generate and confine the acoustic signa/ energy between the reflectors to provide for a higher quality factor (Q) of the resonator 302. However, some of the acoustic signal provided by the resonator 302 can escape the confinement provided by the reflectors of the resonator 302, with the escaped acoustic signal having a thickness propagation mode, similar to the escaped acoustic energy 106 demonstrated in the example of FIG. 1.

As shown in FIG. 3, the electromechanical resonator 300 includes a curved surface 308 on a second side 310 of the substrate 306. In the example shown in FIG. 3, the curved surface 308 can be surrounded by the substrate 306 on four sides with an opening on the second side 310 of the substrate 306. In some examples (not shown in the figures), the curved surface 308 can extend to outer edges of semiconductor substrate 306. As an example, the curved surface 308 can provide a concave recess that is formed in the second side 310 of the substrate 306. For example, the curved surface 308 can be etched in the second side 310 of the substrate 306, such as resulting from a wet or dry etching fabrication process. As an example, the curved surface 308 can be fabricated based on using a grayscale photoresist, such as to form a more shallow cavity for the curved surface 308. As another example, the curved surface 308 can be fabricated using a reactive ion etch (RIE), such as a deep reactive ion etch (DRIE), for a relatively deeper cavity for the curved surface 308. For example, the curved surface 308 can be formed from patterning an array of trenches with different aspect ratios (e.g., using an RIE fabrication process). In some examples, the curved surface 308 can be grinded and can include a smooth surface. In some examples, the curved surface 308 may not be grinded or may otherwise include additional textures (not shown in the figures). As to be described below, the curvature of the curved surface 308 (based on a ratio of the depth and a width/length of the curved surface) is relatively small, and the etching fabrication process can be performed with minimum (or no) effect on the structural integrity of the substrate 306.

As described herein, the curved surface 308 can be configured to mitigate the spurious mode created by the reflections of the escaped acoustic energy having a thickness propagation mode. As an example, the curved surface 308 can have a characteristic that reflects a property of the resonator 302. For example, as described in greater detail herein, the curved surface 308 can have a depth and a radius of curvature that is related to a resonant frequency of the resonator 302 (and the wavelength of the signal provided by the resonator 302), to introduce destructive interference and scattering to mitigate the spurious mode in the substrate 306. Specifically, because of the curvature, the escaped signal can be reflected in different directions, which can scatter the reflected signals and direct the reflected signals away from the resonator 302. Also, the curved surface can introduce different propagation distances for the escaped signal and the reflected signal in the substrate 306 between first side 304 and the curved surface 308. Accordingly, the reflected signal at different points of the curved surface 308 can have different phase relationships with the escaped signal, and the phase relationships can reflect the wavelength of the signals, which can facilitate destructive interference between the reflected signal and the escaped signal (or at least reduce the constructive interference leading to the formation of standing waves) in the substrate 306. All of these can reduce or eliminate the spurious modes in the substrate 306, which can improve the stability and performance of electromechanical resonator 300. Also, because the curvature of the curved surface is relatively small/shallow compared with the thickness of the substrate 306, the structural integrity of the substrate 306 can also be maintained.

Figure 4:
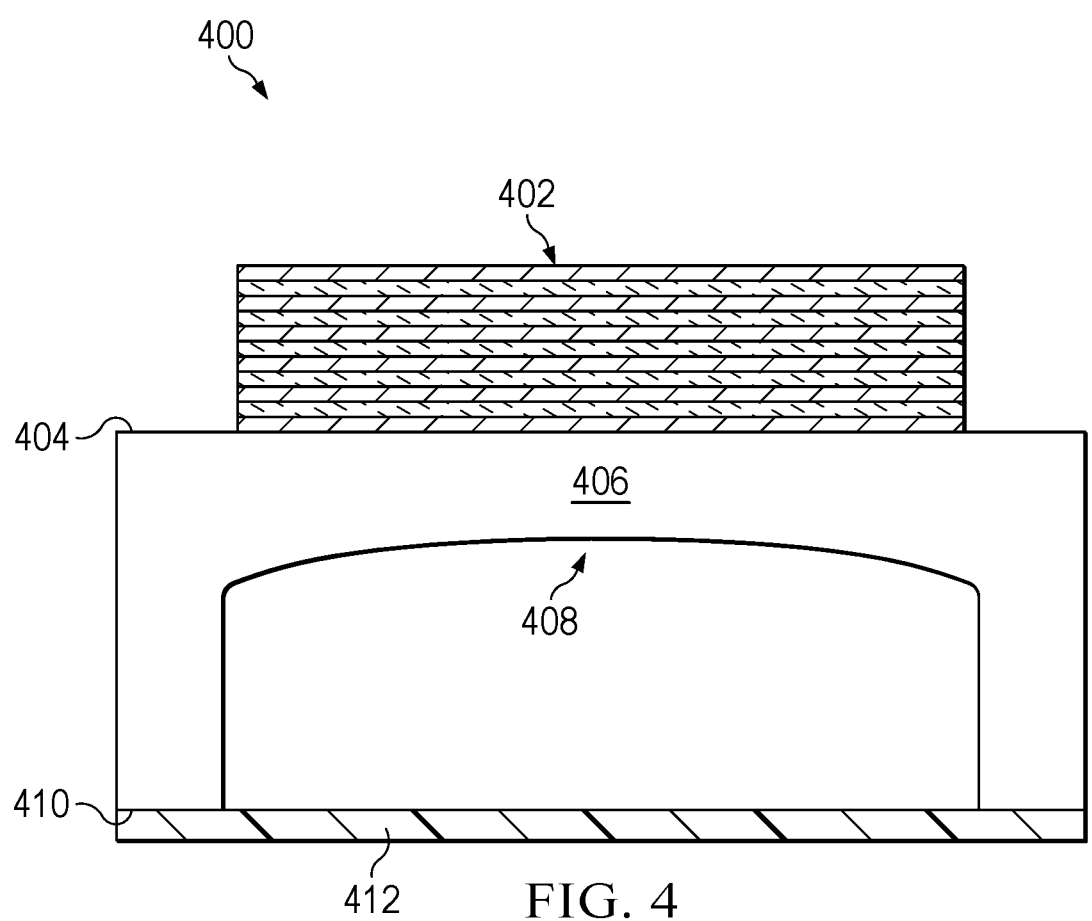
FIG. 4 is a schematic illustrating an example electromechanical resonator.

FIG. 4 is a schematic illustrating a cross-sectional view of an example electromechanical resonator 400. The electromechanical resonator 400 is arranged similar to the electromechanical resonator 300 in the example of FIG. 3. In the example of FIG. 4, the electromechanical resonator 400 includes a resonator 402 formed on a first side 404 of a substrate 406. As an example, the resonator 402 can correspond to an acoustic resonator, such as a BAW resonator, that includes a piezoelectric material arranged between electrodes and acoustic reflectors (e.g., Bragg reflectors). The electromechanical resonator 400 also includes a curved surface 408 formed on a second side 410 of the substrate 406. Therefore, similar to the electromechanical resonator 300, the curved surface 408 can be configured to mitigate reflections of the escaped acoustic energy having a thickness propagation mode. Similar to as described above in the example of FIG. 3, in some examples, the curved surface 408 can be surrounded by the substrate 406 on four sides with an opening on the second side 410 of the substrate 406.

In the example of FIG. 4, the electromechanical resonator 400 also includes a material layer 412 that is arranged on the second side 410 of the substrate 406, such as to cover the opening of the curved surface 408 on the second side 410. As an example, the material layer 412 can correspond to a die attach film (DAF) that is provided on the second side 410, such as to cover and seal the curved surface 408. As an example, the material layer 412 can provide that curved surface 408 is filled with air to facilitate greater reflection of the escaped acoustic energy in directions away from the resonator 402. As another example, the curved surface 408 can be filled with any of a variety of other materials or can be subjected to low pressure (or vacuum), such as to dampen and/or facilitate greater reflection of the escaped acoustic energy. For example, the material layer 412 can be attached onto the second side 410 of the substrate 406 sealing/covering the curved surface 408, as described above.

Figure 5A:
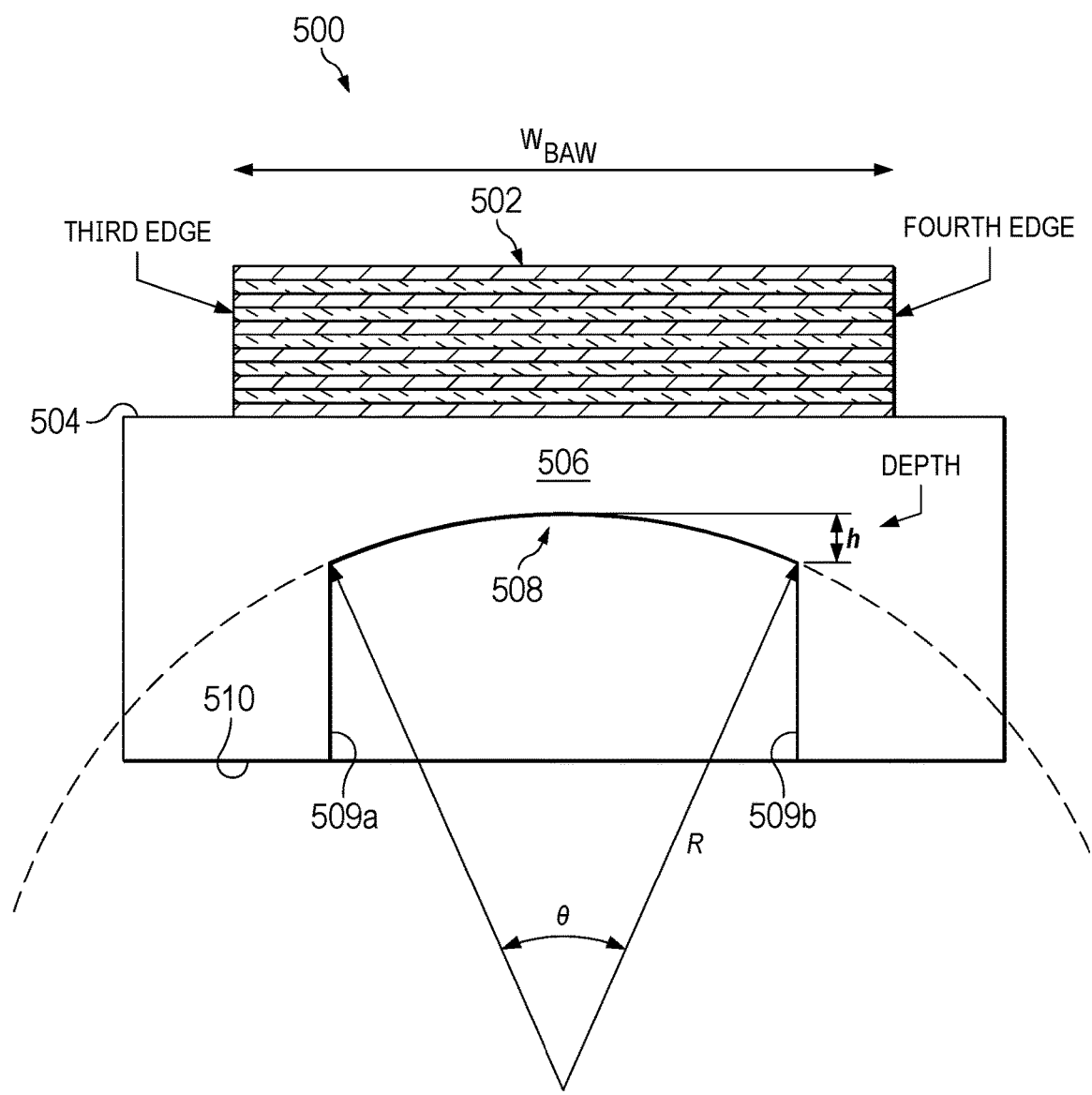
FIG. 5A is a schematic illustrating various dimensions of an example curved surface of an electromechanical resonator.

FIG. 5A is a schematic of a cross-sectional view of an electromechanical resonator 500. The electromechanical resonator 500 can correspond to either of the electromechanical resonators 300 or 400 in the examples of FIGS. 3 and 4, respectively. The electromechanical resonator 500 includes a resonator 502, such as a BAW resonator, on a first side 504 of a substrate 506. The electromechanical resonator 500 demonstrates an example of dimensions of the curved surface, demonstrated in the example of FIG. 5 at 508 formed in a second side 510 of the substrate 506. Similar to as described above in the examples of FIGS. 3 and 4, in some examples the curved surface 508 can be surrounded by the substrate 506 on four sides with an opening on the second side 510 of the substrate 506.

As described above, the curved surface 508 can have dimensions that are related to the resonant frequency of the resonator 502 and/or the wavelength of the acoustic signal generated by the resonator 502. In the example of FIG. 5, the curved surface 508 can be fabricated as a circular concave portion that has is defined as portion of a circle having a radius R bounded by an angle θ. The periphery of the portion of the circle defined by the radius R and the angle (can define a first edge 509*a* and a second edge 509*b* of the curved surface 508. In the example of FIG. 5, the first edge 509*a* and the second edge 509*b* extend as sidewalls from the periphery of the portion of the circle defined by the radius R and the angle θ to the second side 510 of the substrate 506. The curved surface 508 has a midpoint that is approximately centered with the center of the circle, such that the first and second edges are symmetrical about the midpoint. The curved surface 508 can thus have a depth having a dimension h that defines a distance between the midpoint and the first and second edges along the distance between the first side 504 and the second side and 510 of the substrate 506.

As described herein, the curved surface 508 can have dimensions that are related to the dimensions of the resonator 502. For example, the depth h can have a dimension that is based on the wavelength of the acoustic signal generated by the resonator 502, which also reflects the resonant frequency. For example, the dimensions of the curved surface 508 can be expressed as an optimization problem to calculate the radius R of the circular concave portion, as follows:

$$R = \frac{W_{BAW}^2}{8h} + \frac{h}{2} \qquad \text{(Equation 1)}$$

$$h = f(\lambda_{Si}) \qquad \text{(Equation 2)}$$

$$\lambda_{Si} = \frac{\sqrt{c_{11}/\rho}}{f_r} \qquad \text{(Equation 3)}$$

In Equations 1, 2, and 3 above, $W_{BAW}$ represents a width of the resonator 502. For a thickness mode resonator having top and bottom electrodes, $W_{BAW}$ can represent a shorter of the length or the width of an electrode of the resonator 502. Accordingly, the radius R can be based on a shortest dimension measured from the center of the resonator 502 to the closest edge (e.g., first edge 509*a*, second edge 509*b*). Also, h represents the depth and is a function of $\lambda_{Si}$, which is a wavelength of the signal propagating in the substrate 506 (e.g., silicon). Further, $c_{11}$ represents the elastic coefficient in the normal direction of the substrate 506, ρ represents the mass density of the substrate 506, both of which depends on the material of the substrate 506 (e.g., silicon), and $f_r$ represents the resonant frequency of the resonator 502. For example, for a substrate 506 formed by silicon, the wavelength of the thickness mode generated by the resonator 502 and coupled into the substrate 506 can be approximately equal to 3.4 μm.

In some examples, the radius R and the depth h can be determined based on finding a minimum curvature/arc needed to mitigate the spurious mode to below a target amplitude/power, for a particular resonator width $W_{BAW}$ and a particular signal wavelength $\lambda_{Si}$ (or a particular resonant frequency $f_r$). The following table illustrate examples of depth h, radius R, and resonator width $W_{BAW}$:

TABLE 1

|  | $W_{BAW}$ = 150 μm | $W_{BAW}$ = 50 μm |
| --- | --- | --- |
| h = λ | R = 829 μm | R = 94 μm |
| h = λ/5 | R = 4136 μm | R = 460 μm |

TABLE 1-continued

| | $W_{BAW}$ = 150 µm | $W_{BAW}$ = 50 µm |
|---|---|---|
| h = λ/10 | R = 8272 µm | R = 919 µm |
| h = λ/20 | R = 16544 µm | R = 1838 µm |

Figure 5B:
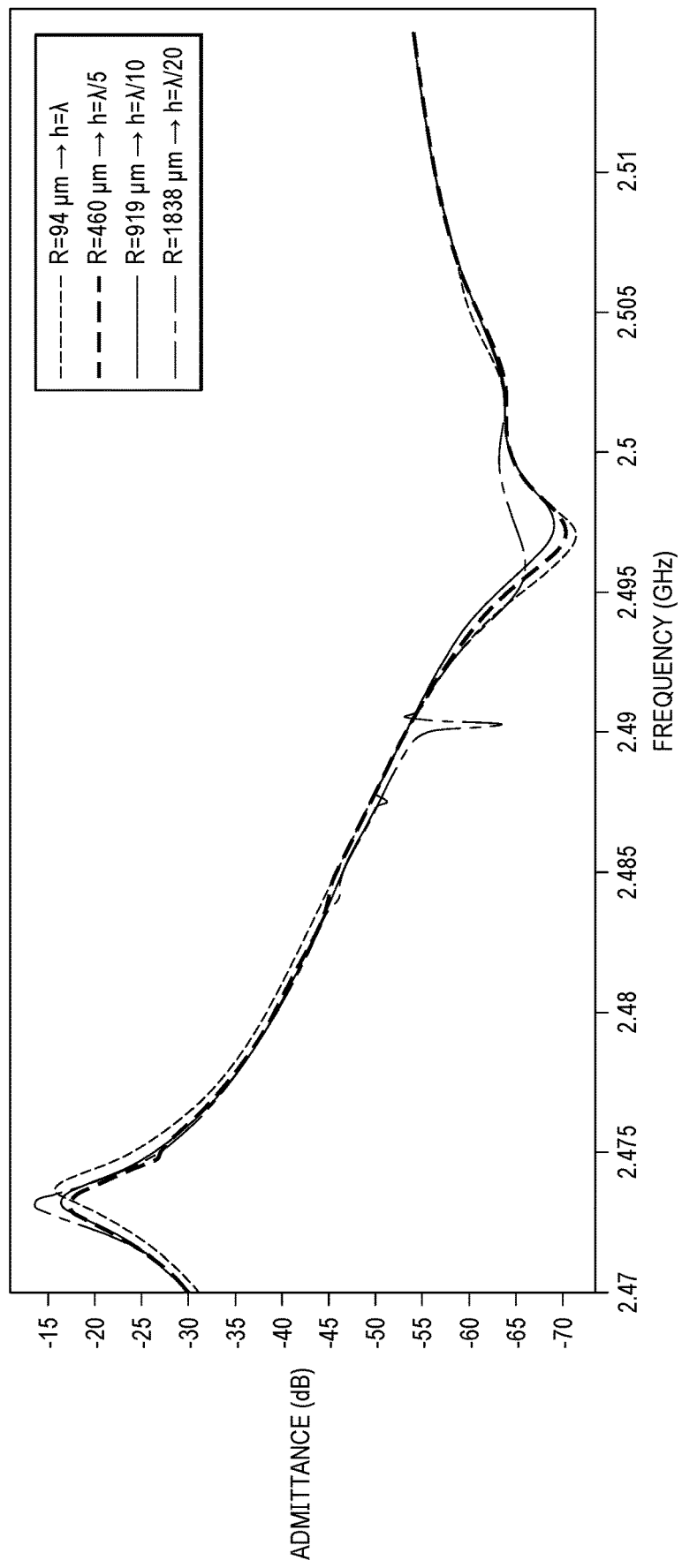
FIG. 5B include graphs that illustrate example relationships between the properties of the curved surface and the dimensions.

FIG. 5B illustrates example relationships between admittance and signal frequency of electromechanical resonator 500 having a resonant frequency of 2.473 GHz with $W_{BAW}$ of 50 µm and for different radius R and depth h. Referring to FIG. 5B, having depth h at λ/5 can suppress the spurious mode at 2.49 GHz, and the radius R of the curvature can be determined from Table 1 or from Equation 1 above.

In the example of FIG. 5A, the periphery of the curved surface 508 defined by the first and second edges can subsume the periphery of the resonator 502 defined by third and fourth edges. Stated another way, the periphery of the resonator 502 defined by third and fourth edges is subsumed by the periphery of the curved surface 508 defined by the first and second edges. In the example of FIG. 5A, the midpoint of the curved surface 508 is approximately aligned with a center of the resonator 502. However, the midpoints of the respective curved surface 508 and resonator 502 can be offset, with neither the third or fourth edges of the resonator 502 extending beyond the first or second edges, respectively. Accordingly, the curved surface 508 can be formed in a variety of ways relative to the dimensions of the resonator 502.

Figure 6:
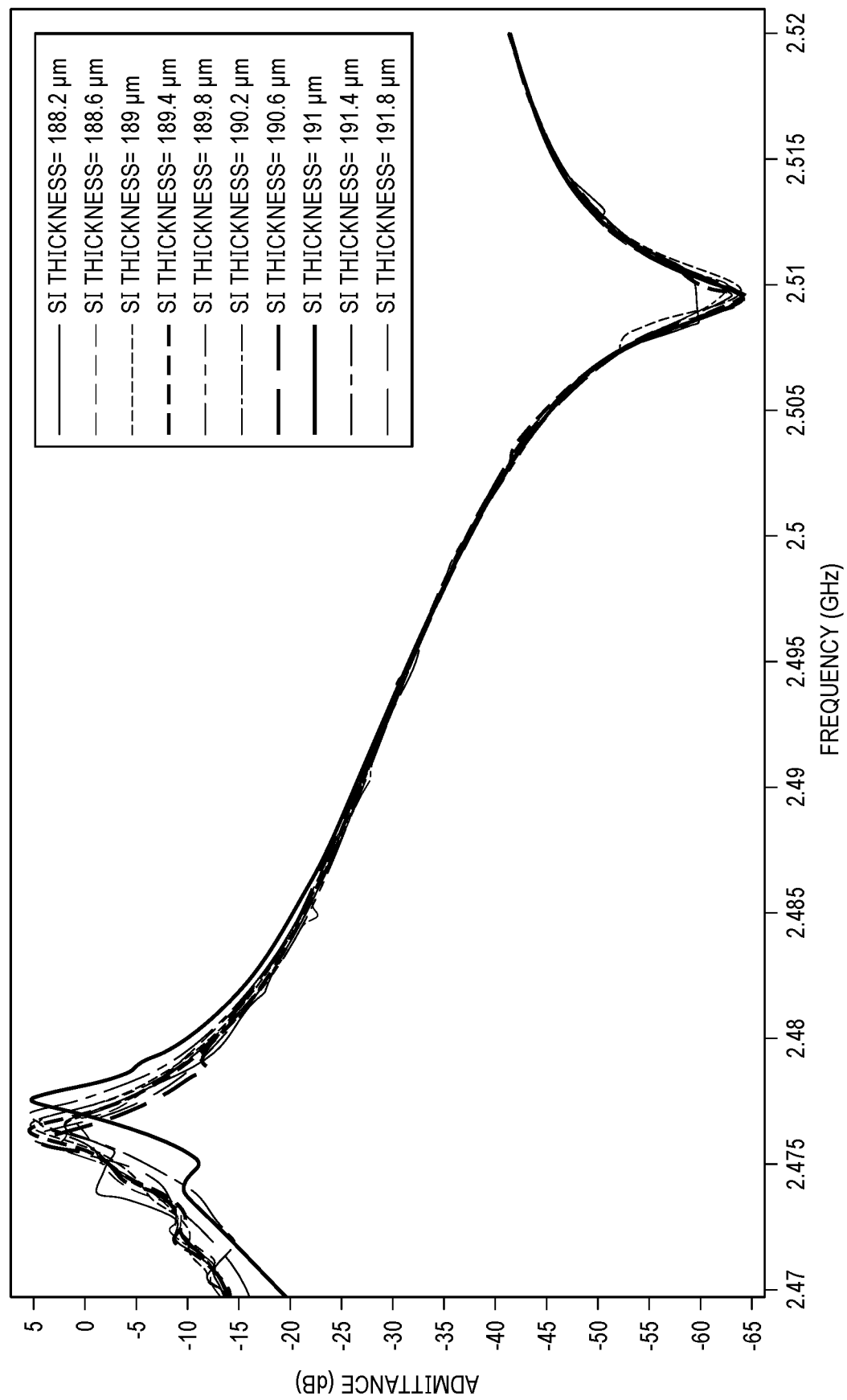
FIG. 6 is a graph illustrating a relationship between admittance and signal frequency of an example electromechanical resonator.

FIG. 6 include graphs 600 illustrating example relationship between admittance and signal frequency of the electromechanical resonator 500 for different thickness of substrate 506 having the curved surface 508 (e.g., nominal thicknesses of the semiconductor substrate prior to etching the curved surface therein). The graph 600 demonstrates admittance values that are approximately the same across the frequency spectrum of frequencies of the acoustic waves for the electromechanical resonator 500. Accordingly, as demonstrated by the graph 600 in the example of FIG. 6, spurious modes exhibited upon the electromechanical resonator 500 resulting from acoustic waves being reflected back to the resonator 502 can be significantly mitigated, as opposed to the spurious modes exhibited by the electromechanical resonator demonstrated by the graph 200 in the example of FIG. 2.

Figure 7A:
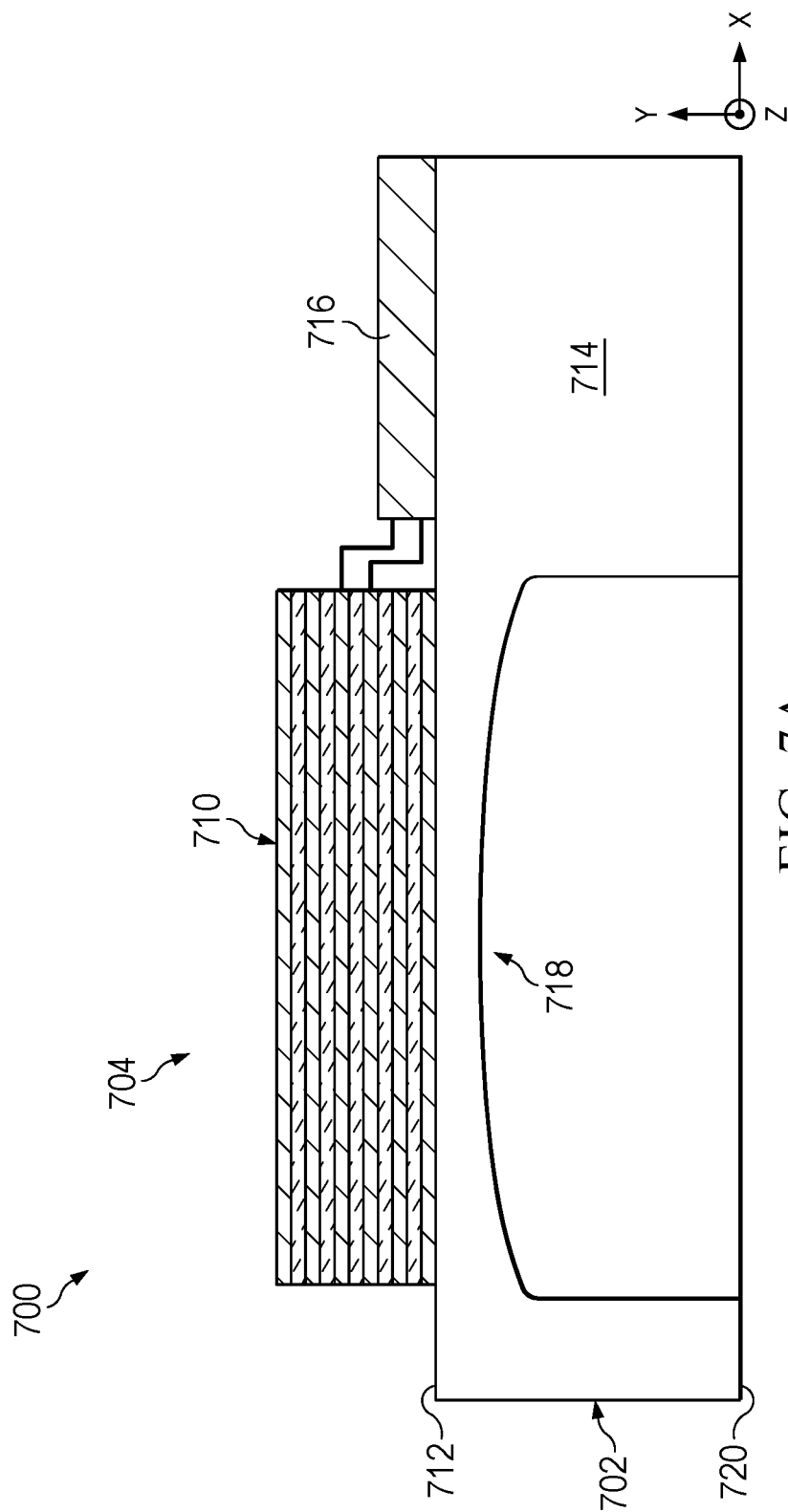
FIGS. 7A, 7B, and 7C are schematics illustrating an example electromechanical resonator.
Figure 7B:
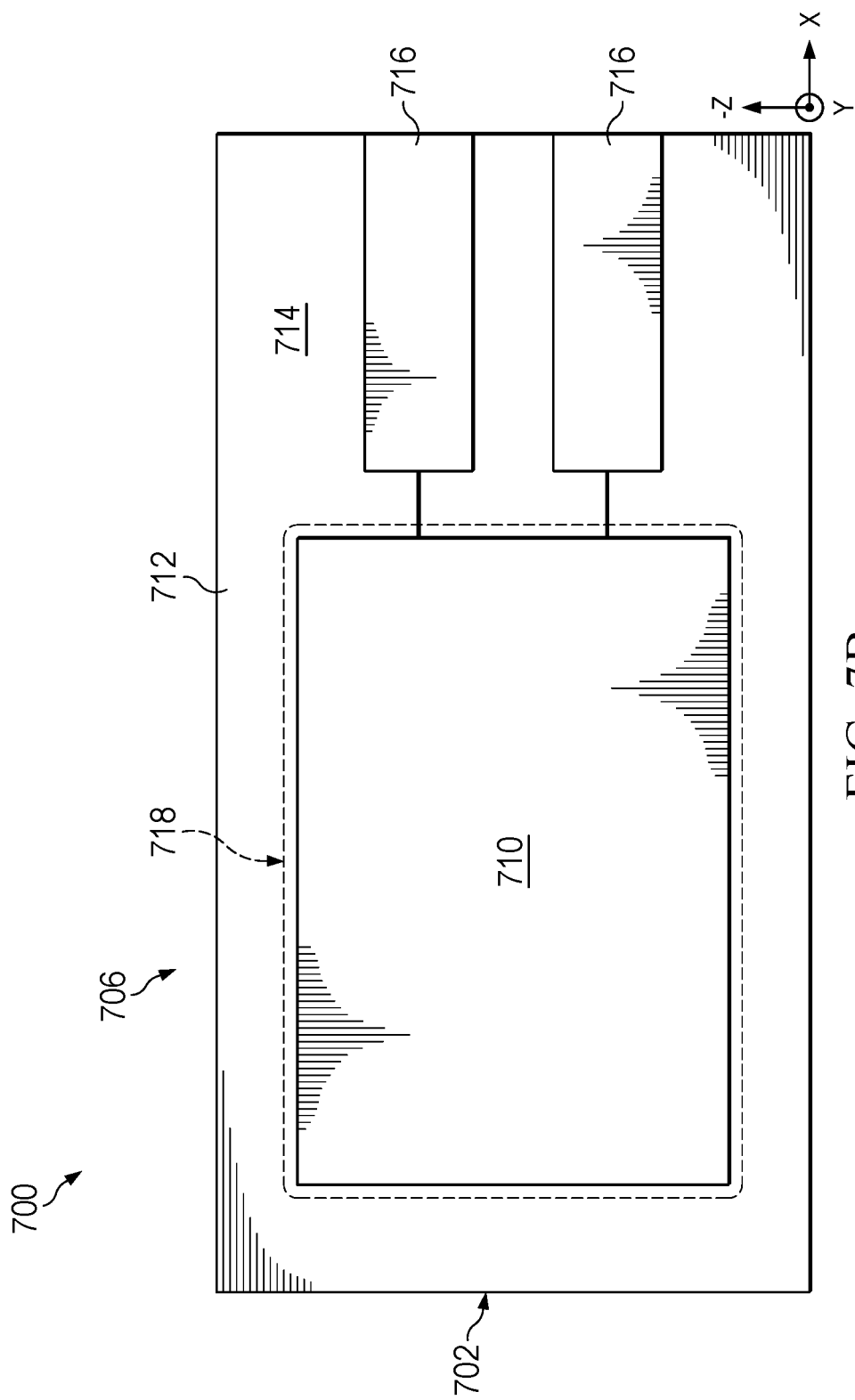
Figure 7C:
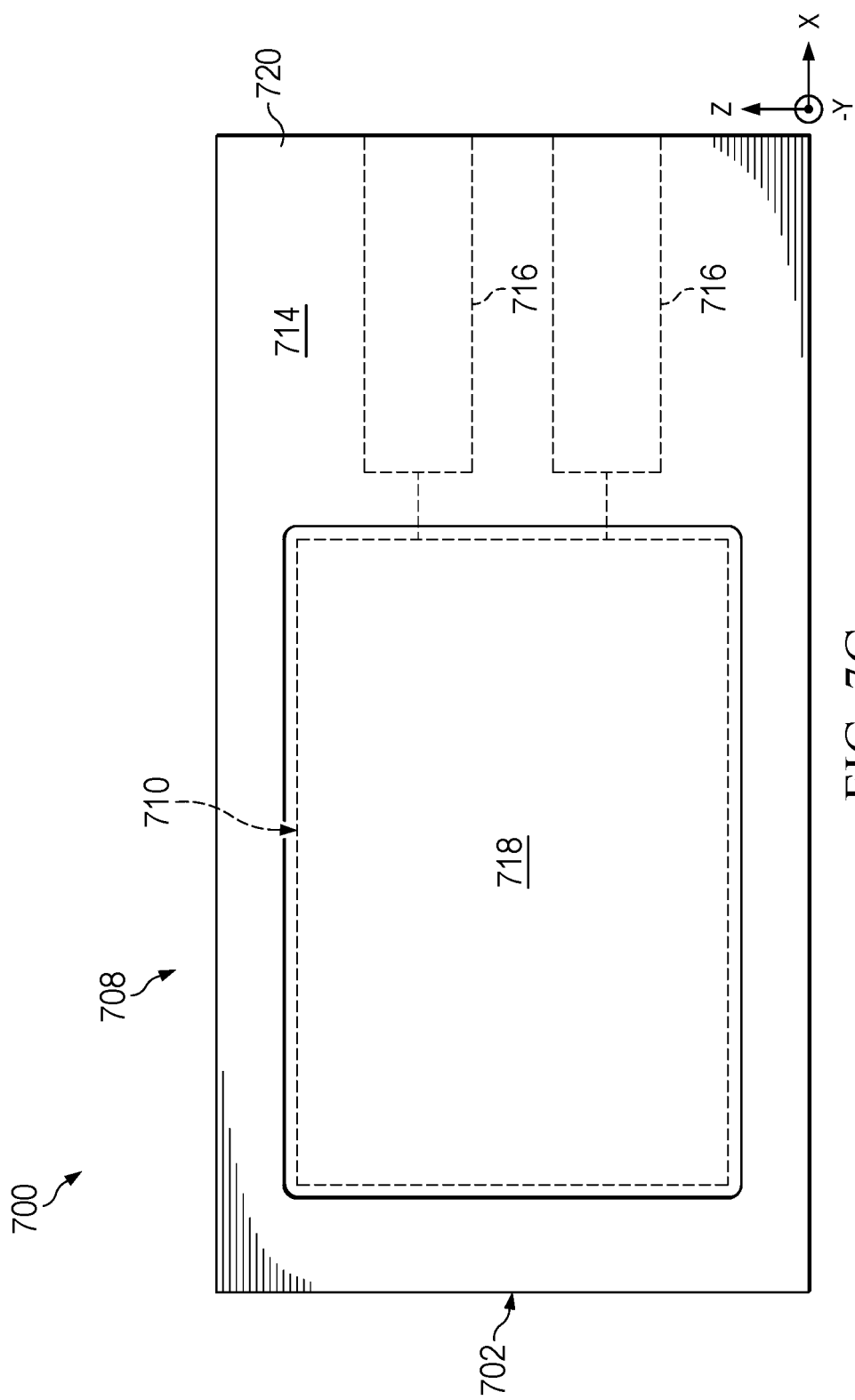

FIGS. 7A, 7B, and 7C are schematics illustrating an example system 700 including an electromechanical resonator 702. The electromechanical resonator 702 is demonstrated in a first view 704 taken as a cross-sectional side view, a second view 706 taken as a top view, and a third view 708 taken as a bottom view. The electromechanical resonator 702 can correspond to any of the electromechanical resonators 300, 400, or 500 described above in the examples of FIG. 3, 4, or 5, respectively.

The electromechanical resonator 702 includes a resonator 710 formed on a first side 712 of a substrate 714. The resonator 710 is demonstrated in the example of FIGS. 7A, 7B, and 7C as a BAW resonator that includes a piezoelectric material arranged between electrodes and acoustic reflectors (e.g., Bragg reflectors). The resonator 710 is provided electrical stimulation from a set of electrical terminals 716 that are formed on the first side 712 of the substrate 714. The electromechanical resonator 702 also includes a curved surface 718 formed on a second side 720 of the substrate 714. As an example, the curved surface 718 can correspond to a concave recess that is formed in the second side 720 of the substrate 714. For example, the curved surface 718 can be etched in the second side 720 of the substrate 714, such as resulting from a wet or dry etching fabrication process. The second side 720 of the electromechanical resonator 702 can be covered by a material layer (not shown), such as the material layer 412 in the example of FIG. 4

Similar to as described above in the example of FIG. 5, and as demonstrated particularly the periphery of the resonator 710 is subsumed by the periphery of the curved surface 718, such that each of the edges that define the boundaries of the curved surface 718 extends laterally farther than the edges that define the boundaries of the resonator 710. The resonator 710 can be formed in a variety of ways as associated with the characteristics of the resonator, such as based on the optimization problem described above in Equation 1 in the example of FIG. 5. Therefore, the curved surface 718 can be configured to mitigate reflections of the escaped acoustic energy having a thickness propagation mode. Therefore, the reflected acoustic energy does not affect the operation of the resonator 710, such as to provide spurious modes associated with the resonator 710.

Figure 8:
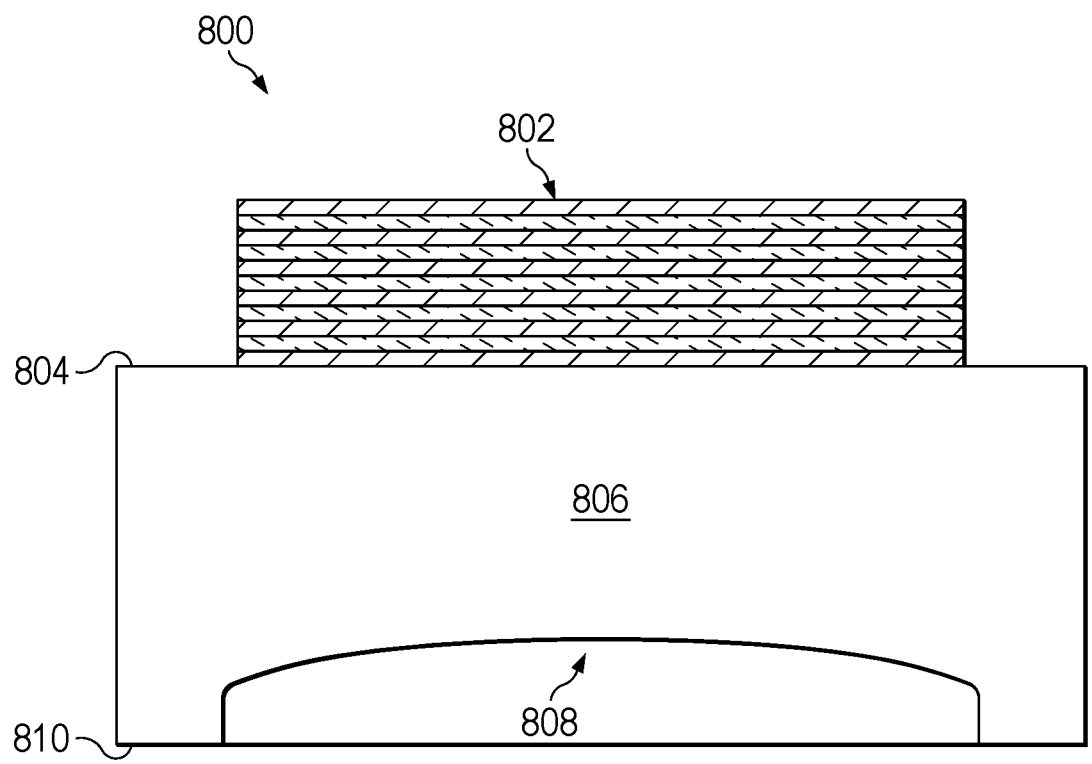
FIG. 8 is a schematic another example diagram of an electromechanical resonator.

FIG. 8 is schematic of an example electromechanical resonator 800. The electromechanical resonator 800 includes a resonator 802 formed on a first side 804 of a substrate 806. As an example, the resonator 802 can correspond to an acoustic resonator, such as a BAW resonator, that includes a piezoelectric material arranged between electrodes and acoustic reflectors (e.g., Bragg reflectors). In the example of FIG. 8, the electromechanical resonator 800 also includes a curved surface 808 formed on a second side 810 of the substrate 806. The curved surface 808 is configured to reflect acoustic energy away from the resonator 802, as described herein.

As described above in the example of FIG. 6, the thickness of the substrate 806 is irrelevant for purposes of providing the benefit of mitigating spurious modes in the resonator 802 based on reflected acoustic energy. The example of FIG. 8 demonstrates that the substrate 806 is significantly thicker than the substrate of the electromechanical resonators 300, 400, 500, and 700 described above in the examples of FIGS. 3, 4, 5A, and 7, respectively. Therefore, the relative dimensions of the thickness of the substrate 806 and the curved surface 808 can vary greatly while still achieving the desired effect of mitigating spurious modes in the resonator 802.

Figure 9:
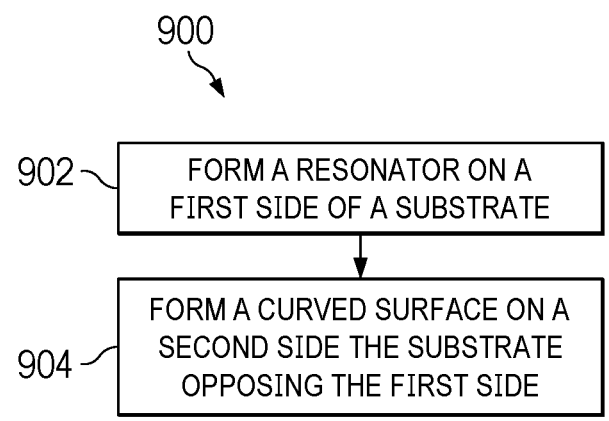
FIG. 9 is a flowchart of an example method for forming an electromechanical system.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 9 is an example of a method 900 for forming an electromechanical system (e.g., the electromechanical resonator 300).

At 902, a resonator (e.g., the resonator 302) is formed on a first side (e.g., the first side 304) of a substrate (e.g., the substrate 306). The substrate can be a semiconductor substrate (e.g., a silicon substrate).

At 904, a curved surface (e.g., the curved surface 308) is formed on a second side (e.g., the second side 310) the substrate opposing the first side. The curved surface can have a curvature that reflects a property of the resonator. The curved surface can be etched in the second side, such as resulting from a wet or dry etching fabrication process. In some examples, the curved surface can be fabricated based on using a grayscale photoresist, such as to form a more shallow cavity for the curved surface. As another example, the curved surface can be fabricated using a reactive ion etch (RIE), such as a deep reactive ion etch (DRIE), for a relatively deeper cavity for the curved surface 308. For example, the curved surface can be formed from patterning an array of trenches with different aspect ratios (e.g., using an RIE fabrication process). In some examples, the curved surface can be grinded and can include a smooth surface. In some examples, the curved surface may not be grinded or otherwise include additional textures.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means within +/−10 percent of the stated value, or, if the value is zero, a reasonable range of values around zero. Modifications are possible in the described examples, and other implementations are possible, within the scope of the claims.

What is claimed is:

1. An electromechanical system comprising:
   a semiconductor substrate having opposing first and second sides, the second side including a surface having a curvature; and
   a resonator on the first side, in which the curvature reflects a property of the resonator.

2. The electromechanical system of claim 1, wherein the resonator is configurable to generate a signal having a particular wavelength, and the curvature is based on the wavelength.

3. The electromechanical system of claim 2, wherein:
   the surface has opposing first and second edges;
   the resonator has opposing third and fourth edges; and
   a periphery defined by the first and second edges is subsumed by a periphery defined by the third and fourth edges.

4. The electromechanical system of claim 3, wherein the resonator has a length and a width shorter than the length, and the third and fourth edges are separated by the width.

5. The electromechanical system of claim 3, wherein:
   the curvature of the surface is symmetrical about a first midpoint between the first and second edges; and
   the first midpoint aligns with a second midpoint between the third and fourth edges.

6. The electromechanical system of claim 5, wherein a depth of the surface at the first midpoint with respect to the first and second edges is based on the wavelength.

7. The electromechanical system of claim 6, wherein the depth is greater than one-fifth of the wavelength.

8. The electromechanical system of claim 2, wherein the curvature is a circular curvature having a radius, and the radius is based on the wavelength.

9. The electromechanical system of claim 8, wherein the radius and an angle spanned by the circular curvature is based on a dimension of the resonator.

10. The electromechanical system of claim 1, wherein the resonator includes a bulk acoustic wave (BAW) resonator.

11. The electromechanical system of claim 1, wherein the BAW resonator exhibits a thickness mode.

12. The electromechanical system of claim 1, wherein the BAW resonator exhibits a combination of thickness and lateral modes.

13. The electromechanical system of claim 1, further comprising a die attach film (DAF) on the second side covering the surface.

14. The electromechanical system of claim 1, wherein the surface on the second side includes textures.

15. A method for forming an electromechanical system, the method comprising:
    forming a resonator on a first side of a semiconductor substrate; and
    forming a surface on a second side the semiconductor substrate opposing the first side, the surface having a curvature that reflects a property of the resonator.

16. The method of claim 15, wherein forming the surface includes etching the second side.

17. The method of claim 16, wherein the etching includes providing a chemical etching process.

18. The method of claim 15, further comprising grinding the second side.

19. The method of claim 15, further comprising forming a die attach film (DAF) on the second side, in which the DAF covers the surface.

20. The method of claim 15, wherein:
the surface has opposing first and second edges;
the resonator has opposing third and fourth edges; and
a periphery defined by the third and fourth edges is subsumed by a periphery defined by the first and second edges.

21. The method of claim 15, wherein the resonator includes a first electrode, a second electrode, and a piezoelectric material between the first and second electrodes.

22. The electromechanical system of claim 1, wherein the resonator includes a first electrode, a second electrode, and a piezoelectric material between the first and second electrodes.

* * * * *